US012607675B2

(12) United States Patent
Zlatanski et al.

(10) Patent No.: US 12,607,675 B2
(45) Date of Patent: Apr. 21, 2026

(54) CIRCUIT BREAKER STATE DETECTOR, AND LOW-VOLTAGE ELECTRICAL SYSTEM INCLUDING CIRCUIT BREAKER STATE DETECTOR

(71) Applicant: ABB Schweiz AG, Baden (CH)

(72) Inventors: Martin Zlatanski, Küsnacht (CH);
Yannick Maret, Dättwil (CH);
Wojciech Piasecki, Cracow (PL);
Matija Varga, Zürich (CH)

(73) Assignee: ABB Schweiz AG, Baden (CH)

( * ) Notice: Subject to any disclaimer, the term of this patent is extended or adjusted under 35 U.S.C. 154(b) by 214 days.

(21) Appl. No.: 17/866,385

(22) Filed: Jul. 15, 2022

(65) Prior Publication Data

US 2023/0019486 A1     Jan. 19, 2023

(30) Foreign Application Priority Data

Jul. 16, 2021    (EP) .................................... 21186128

(51) Int. Cl.
*G01R 31/327* (2006.01)
(52) U.S. Cl.
CPC ................................ *G01R 31/3277* (2013.01)
(58) Field of Classification Search
CPC ............... G01R 31/327; G01R 31/333; G01R 31/3274; G01R 31/3277; H01H 71/04; H01H 9/16; H01H 47/00; H01H 47/002; H01H 1/20; H01H 1/58; H01H 33/022
See application file for complete search history.

(56) References Cited

U.S. PATENT DOCUMENTS

2006/0212745 A1     9/2006  Zansky et al.
2017/0205455 A1     7/2017  Weicker et al.

FOREIGN PATENT DOCUMENTS

CN        105143897 A     12/2015
CN        105143987 A     12/2015
CN        107015139 A      8/2017

(Continued)

OTHER PUBLICATIONS

American National Standard for Electric Power Systems and Equipment Voltage Ratings (60 Hertz)—2019.*

(Continued)

*Primary Examiner* — Son T Le
(74) *Attorney, Agent, or Firm* — McCarter & English, LLP; Michael M. Gnibus

(57) ABSTRACT

A circuit breaker is connected between an input supply line and an output supply line of a low-voltage electrical system and comprises a test signal transceiver and evaluator. The test signal transceiver comprises a first transceiver section being capacitively or inductively coupled, at a first coupling point, with the input supply line, and a second transceiver section being inductively coupled, at a second coupling point, with the input or output supply line. One of the first and second transceiver section is a test signal transmitter configured to generate and inject an AC test signal into the input or output supply line, and the other one of the first and second transceiver section is a test signal receiver configured to receive the test signal from the input or output supply line. A test signal evaluator is configured to determine the state of the circuit breaker from the received test signal.

17 Claims, 6 Drawing Sheets

(56)　　　　　References Cited

FOREIGN PATENT DOCUMENTS

| | | | | |
|---|---|---|---|---|
| CN | 112219124 | A | 1/2021 | |
| CN | 112951671 | A | 6/2021 | |
| DE | 102018114425 | A1 | 12/2019 | |
| EP | 2988142 | A2 | 2/2016 | |
| EP | 2995966 | A1 * | 3/2016 | ......... G01R 31/3271 |
| WO | 2014140104 | A1 | 9/2014 | |

OTHER PUBLICATIONS

European search report for priority application EP 21186128, Dated Dec. 16, 2021, 8 pages.
Office Action issued in Chinese Application No. 2022108316223 dated Jun. 25, 2024.

* cited by examiner

CIRCUIT BREAKER STATE DETECTOR, AND LOW-VOLTAGE ELECTRICAL SYSTEM INCLUDING CIRCUIT BREAKER STATE DETECTOR

CROSS-REFERENCE TO RELATED APPLICATIONS

This application claims priority to European Application No 21186128.1, filed on Jul. 16, 2021 and titled "CIRCUIT BREAKER STATE DETECTOR, AND LOW-VOLTAGE ELECTRICAL SYSTEM INCLUDING CIRCUIT BREAKER STATE DETECTOR", which is hereby incorporated by reference in its entirety.

BACKGROUND

The disclosure generally relates to a circuit breaker state detector for determining a state of a circuit breaker in a low-voltage electrical system, and to a low-voltage electrical system comprising the circuit breaker state detector.

Low voltage electrical systems, such as electrical installations at residential, commercial business or industrial sites, include one or more electrical panels to divide the electrical power fed from the utility company's power grid into subsidiary circuits. Conductors in the subsidiary circuits are protected by means of a set of circuit breakers. In general, such circuit breakers have standardized dimensions and means for mounting, e.g. for allowing a mounting on rails within the panel. Since the panels usually have a given size, the number of elements (e.g., circuit breakers) on the rails is limited.

Some applications require that the state of a circuit breaker within the panel is monitored. The state typically includes the switching or tripping state of the circuit breaker, i.e. an information as to whether a path across the circuit breaker is conductive or tripped. Examples of such applications include recent smart-home devices, but are not limited thereto. Further examples of such application include electrical installations that include distribution and sub-distribution panels at different physical locations. Having an information about which circuit breaker is in a tripped state may allow for a fast resolution time in case of a fault.

According to the conventional technology, for example, a side accessory is provided to the breaker. The side accessory comprises an additional unloaded switch, or dry switch, that is mechanically coupled to the circuit breaker. The state of the dry switch is easily read out by an I/O accessory. This conventional technology needs additional space on the rail. A retrofitting has the additional disadvantage that neighboring space is needed for the side accessory for each circuit breaker to be retro-equipped.

BRIEF DESCRIPTION

According to an aspect, a circuit breaker state detector is provided. The circuit breaker state detector is configured to determine a state of a circuit breaker. The circuit breaker is connected between an input supply line and an output supply line of a low-voltage electrical system. The circuit breaker state detector comprises a test signal transceiver and a test signal evaluator. The test signal transceiver comprises a first transceiver section and a second transceiver section. The first transceiver section is capacitively or inductively coupled with the input supply line. The coupling point or region of the first transceiver section with the input supply line is referred to as a first coupling point. The second transceiver section is inductively coupled with the input supply line or the output supply line. The coupling point or region of the second transceiver section with the input or output supply line is referred to as a second coupling point. One of the first transceiver section and the second transceiver section is a test signal transmitter. The other one thereof is a test signal receiver. The test signal transmitter is configured to generate an AC test signal and to inject the AC test signal into the input supply line or the output supply line, whatever applies. The test signal receiver is configured to receive the test signal from the input supply line or output supply line, whatever applies. The test signal evaluator is connected to the test signal transceiver. The test signal evaluator is configured to determine the state of the circuit breaker.

A low-voltage electrical system, as used herein, typically refers to an electrical system having an AC RMS voltage of less than 1000 V between a phase and neutral or having a DC voltage of less than 1500 V between conductors of different polarities or having a DC voltage of less than 900 V between conductors and earth.

An input supply line, as used herein, is typically a line (or branch, or conductor) for delivery of electrical power from the utility grid, and prior to having undergone a protection in the distribution(s) via the circuit breaker as the protective element. An input supply line, however, may include a line electrically downstream of a superordinate protective element, such as an electric main line downstream of a main breaker or main fuse. Also, e.g. in a cascaded installation of a (superior) distribution panel and one or more sub-distribution panel, the input supply line may include a line electrically downstream of a superordinate protective element in the superior distribution panel.

An output supply line, is typically a line (or branch, or conductor) for delivery of electrical power from a point electrically downstream of the circuit breaker to subordinate elements. The subordinate elements may include, for example, a sub-distribution panel, an electrical installation including a load or connectible to a load, etc.

The state typically includes an information as to whether a path across the circuit breaker is conductive or tripped. In other words: The state may include the information as to the tripping state of the circuit breaker, i.e. whether it is ON or OFF.

According to a further aspect, a low-voltage electrical system is provided. The system comprises at least one input supply line and at least one output supply line, a circuit breaker connected between the input supply line and the output supply line, and a circuit breaker state detector as described herein.

Further features are derivable from the dependent claims.

In an embodiment, the circuit breaker state detector comprises a first unit including the first transceiver section and the test signal evaluator. The circuit breaker state detector further comprises a second unit including the second transceiver section. The second unit is located next to the circuit breaker. Typically, the second unit is located at a distance from the first unit. Typically, the second transceiver section in the second unit is the test signal transmitter.

In an alternative embodiment, the circuit breaker state detector comprises a first unit including the first transceiver section. The circuit breaker state detector further comprises a second unit including the second transceiver section and the test signal evaluator. The second unit is located next to the circuit breaker. Typically, the second unit is located at a distance from the first unit. Typically, the second transceiver section in the second unit is the test signal receiver.

Being located next to the circuit breaker, as used herein, typically includes a location within the same distribution panel, such as but not limited to next to the circuit breaker, or on the same rail or a neighboring rail of the distribution panel. Being located at a distance from the first unit, as used herein, typically includes a location spaced apart several centimeters to several meters from the first unit, such as within the same distribution panel, but on a different rail, or in a different distribution panel, such as a sub-distribution panel.

In typical embodiments, the circuit breaker state detector comprises one first unit and multiple second units. The first transceiver section in the first unit may be coupled to different input supply lines. Each of the second transceiver sections in the respective second units is coupled to one input or output supply line.

In yet an alternative embodiment, the first transceiver section, the second transceiver section and the test signal evaluator are integrated in a same housing located next to the circuit breaker. Having a same housing may improve the handling of the unit and attribute to a clear arrangement of the layout in the installation.

In embodiments, the circuit breaker state detector comprises at least two second transceiver sections each inductively coupled with a different input supply line or output supply line to receive the test signal as a line-attributed test signal from the respective input or output supply line. A line-attributed test signal, in an AC electrical system, may include a test signal attributed to a certain phase of the AC system. A line-attributed test signal, in a DC electrical system, may include a test signal attributed to a certain polarity of the DC system. In a branched system, e.g. a system in which the input supply line is split, via multiple circuit breakers, to a plurality of output supply lines, a line-attributed test signal may include a test signal attributed to a certain branch of the system. An attributed test signal, as used herein, may allow for an identification of the phase, polarity, branch or location of the circuit breaker whose state is determined or evaluated.

In embodiments, the test signal has a frequency of more than 100 kHz. In particular, the test signal has a frequency of more than 500 kHz. In some embodiments, the test signal has a frequency of between 500 kHz and 100 MHz. A frequency of the test signal in these ranges may help to reduce or avoid a resonance phenomenon that may occur in an electrical distribution having typical wiring lengths. In addition, a frequency of the test signal in these ranges may also help to avoid noise produced by electrical devices connected to the electrical network.

In embodiments, the test signal transmitter is configured to generate continuous or a pulsed sinusoidal signal or a pulsed square wave as the test signal. In the case of a continuous sinusoidal signal, the signal is injected essentially continuously by the test signal transmitter, at least throughout a period in which the test signal is evaluated. In the case of a pulsed sinusoidal signal, a sine wave is intermittently injected by the test signal transmitter. In the case of a pulsed square wave, a square wave is intermittently injected by the test signal transmitter. A pulsed or intermittent injection may help in distinguishing the received signal from an unwanted signal, such as noise.

In embodiments, the test signal evaluator is configured to evaluate a variation of the received test signal over time to determine the state of the circuit breaker. For example, a transition of the test signal between two levels may be evaluated as a switching operation of the respective circuit breaker.

In embodiments, the test signal receiver comprises a test signal reception stage and at least one multiplexer. An input terminal of the at least one multiplexer is coupled with an output terminal of the test signal reception stage. Output terminals of the at least one multiplexer are coupled with a filter stage. The test signal reception stage is configured to receive the test signal and output a first derived signal and a second derived signal of the test signal at the output terminal, the first and second derived signals being approximately 180° phase shifted to each other. The at least one multiplexer is configured to output the respective first and second derived signals multiplied by a square wave having a frequency of about the test signal frequency.

In embodiments, the low-voltage electrical system is an AC system comprising an input supply line for each phase and an output supply line for each phase, and comprising a neutral line and/or a ground line. The first transceiver section and the second transceiver section are coupled between input and/or output supply lines and the neutral line or the ground line.

In embodiments, the low-voltage electrical system is a DC system comprising an input supply line for each polarity and an output supply line for each polarity, wherein the first transceiver section and the second transceiver section are coupled between input and/or output supply lines of different polarities.

DETAILED DESCRIPTION

Figure 1:
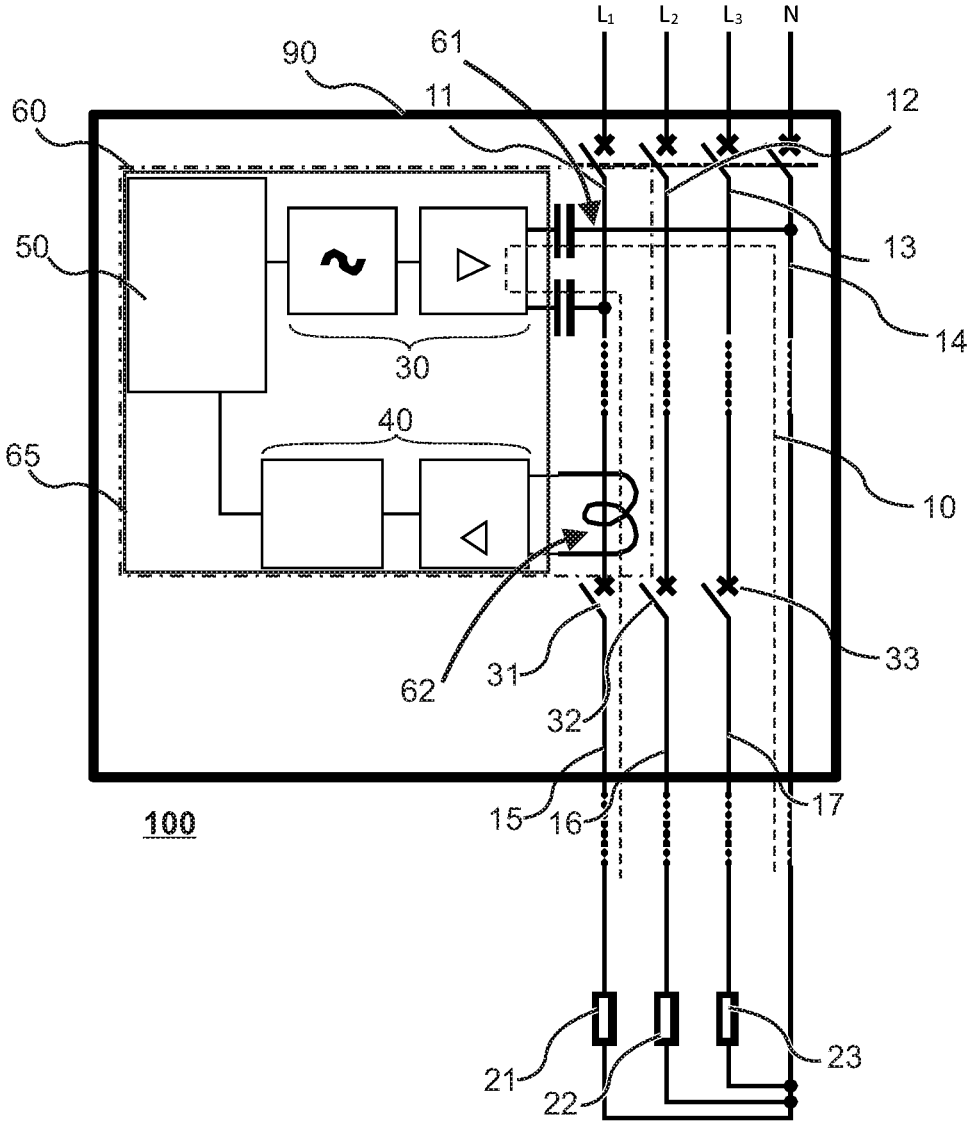
FIG. 1 illustrates a schematic diagram of a low-voltage electrical system and a circuit breaker state detector according to an embodiment.

In the following, embodiments are set forth to describe specific examples presented herein. The person skilled in the art will recognize that one or more other examples and/or variations of these examples may be practiced without all the specific details outlined below. Also, well known features may not be described in detail so as not to obscure the description of the examples herein. For the ease of illustration, like reference numerals are used in different figures to refer to the same elements or additional instances of the same element.

Low voltage electrical installations are used in residential, commercial or industrial contexts. In a low voltage installation, AC RMS voltages typically do not exceed 1000 V between phase and neutral, or DC voltages typically do not exceed 1500 V between conductors of different polarities or 900 V between conductors and earth. In an electrical panel, or cabinet, of a low voltage installation, the conductors downstream to the loads are provided with circuit breakers for overcurrent or short circuit protection.

FIGS. 1, 2, 5, 6 each show a low voltage electrical system 100. Throughout the figures, AC systems are shown, but no limitation to AC systems is intended, and the technology described herein is also applicable to DC systems. In the AC system 100 of FIGS. 1, 2, 5, 6, phase conductors $L_1$, $L_2$, $L_3$ and a neutral conductor from a superior installation site, such as a main breaker or a main fuse (both not shown) enter a cabinet 90.

The cabinet 90 contains electrical low voltage installation including circuit breakers 31, 32, 33. The lines of phases $L_1$, $L_2$, $L_3$ upstream of the circuit breakers 31, 32, 33 and belonging to the low voltage electrical system 100 as used herein are denoted 11, 12, 13, respectively. The neutral line belonging to the low voltage electrical system 100 as used herein is denoted 14.

The circuit breakers 31, 32, 33 protect the lines 15, 16, 17 connected thereto at their downstream ends. These lines are referred to as output supply lines. One non-limiting example for a circuit breaker used in a residential installation is a one-pole miniature circuit breaker having a nominal current of 16A, such as ABB S201-16A. The output supply lines 15, 16, 17 are connected or connectible to loads 21, 22, 23 that are typically located, without limitation, outside the cabinet 90. Note that although throughout the figures, the output supply lines 15, 16, 17 are shown as being connected each to a single (part of a) load 21, 22, 23. However, there is no limitation as to the number of loads connected to the output supply lines 15, 16, 17. Furthermore, the output supply lines 15, 16, 17 may branch, and/or two or more circuit breakers (not shown) per phase $L_1$, $L_2$, $L_3$ may be provided in the cabinet to provide multiple branches of output supply lines 15, 16, 17 per phase. Furthermore, the loads are shown connected between a phase and the neutral but there is no limitation on how the loads are connected: in particular a single load may be connected to more than one phase and the neutral line may not be connected.

The present embodiments provide a means for determining a state of the circuit breakers 31, 32, 33, such as an information as to whether a respective one of the circuit breakers 31, 32, 33 is in a conductive state (an ON state) where current is allowed to pass from the respective input supply line 11, 12, 13 to the respective output supply line 15, 16, 16, or in a non-conductive state or tripped state (an OFF state) where the current is switched off.

A circuit breaker state detector 60 comprises a test signal transceiver and a test signal evaluator 50. The test signal transceiver has a first transceiver section 30 and a second transceiver section 40. The first transceiver section 30 is coupled with an input supply line (in FIGS. 1, 2, 5, 6, without limitation: input supply line 11) by means of a capacitive or inductive coupling means. A capacitive coupling means is e.g. a coupling capacitor. An inductive coupling means is e.g. a coupling reactor. The second transceiver section 40 is coupled with either an input supply line (in FIGS. 1 and 2, without limitation: input supply line 11) or with an output supply line 15, 16, 17 (in FIGS. 5 and 6, without limitation: output supply line 15). In either way, the second transceiver section 40 is coupled with the respective line by means of an inductive coupling means. Again, the inductive coupling means is e.g. a coupling reactor.

Although in the figures, the test signal transceiver and the test signal evaluator 50 are shown as a single unit, there is no such limitation. The test signal transceiver and the test signal evaluator 60 may be separate units or, more generally speaking, comprise separate elements. Information, e.g.

data, may be exchanged between the separate units or separate elements by any appropriate kind of signal transmission. As an example, the information may be exchanged via a data bus. The data bus may be a wired bus, such as—but not limited to—M-Bus (Meter-Bus), CAN bus, FlexRay, LAN, or others. The data bus may also be a wireless bus, such as—but not limited to—wireless M-Bus. The information exchanged between the separate units or separate elements may include a frequency (a working frequency), such as the test signal frequency.

One of the first transceiver section 30 and the second transceiver section 40 is a test signal transmitter. In the embodiments shown in FIGS. 1, 2, 5, 6, it is the first transceiver section 30 acting as the test signal transmitter. The other one of the first transceiver section 30 and the second transceiver section 40 is a test signal receiver. In the embodiments shown in FIGS. 1, 2, 5, 6, it is the second transceiver section 40 acting as the test signal receiver.

The test signal transmitter typically comprises an oscillator unit for generating the test signal, and a driver unit for injecting the generated test signal, via the capacitive or inductive coupling means, into the respective one of the input supply line or the output supply line, whatever applies in the actual setup. In other words: The test signal may be injected into the respective line or conductor that is attached to the low-voltage circuit breaker under test. The test signal is typically a sinus signal (single tone) or a pulsed sinus signal. A sinus signal or pulsed sinus signal typically reduces issues relating to electromagnetic compatibility (EMC) arising from steep signal edges.

The test signal transceiver typically comprises a receiver unit for receiving the test signal, via the capacitive or inductive coupling means, from the respective one of the input supply line or the output supply line, whatever applies in the actual setup. In other words: The test signal may be read from the line or conductor that is attached to the low-voltage circuit breaker under test.

Figure 3:
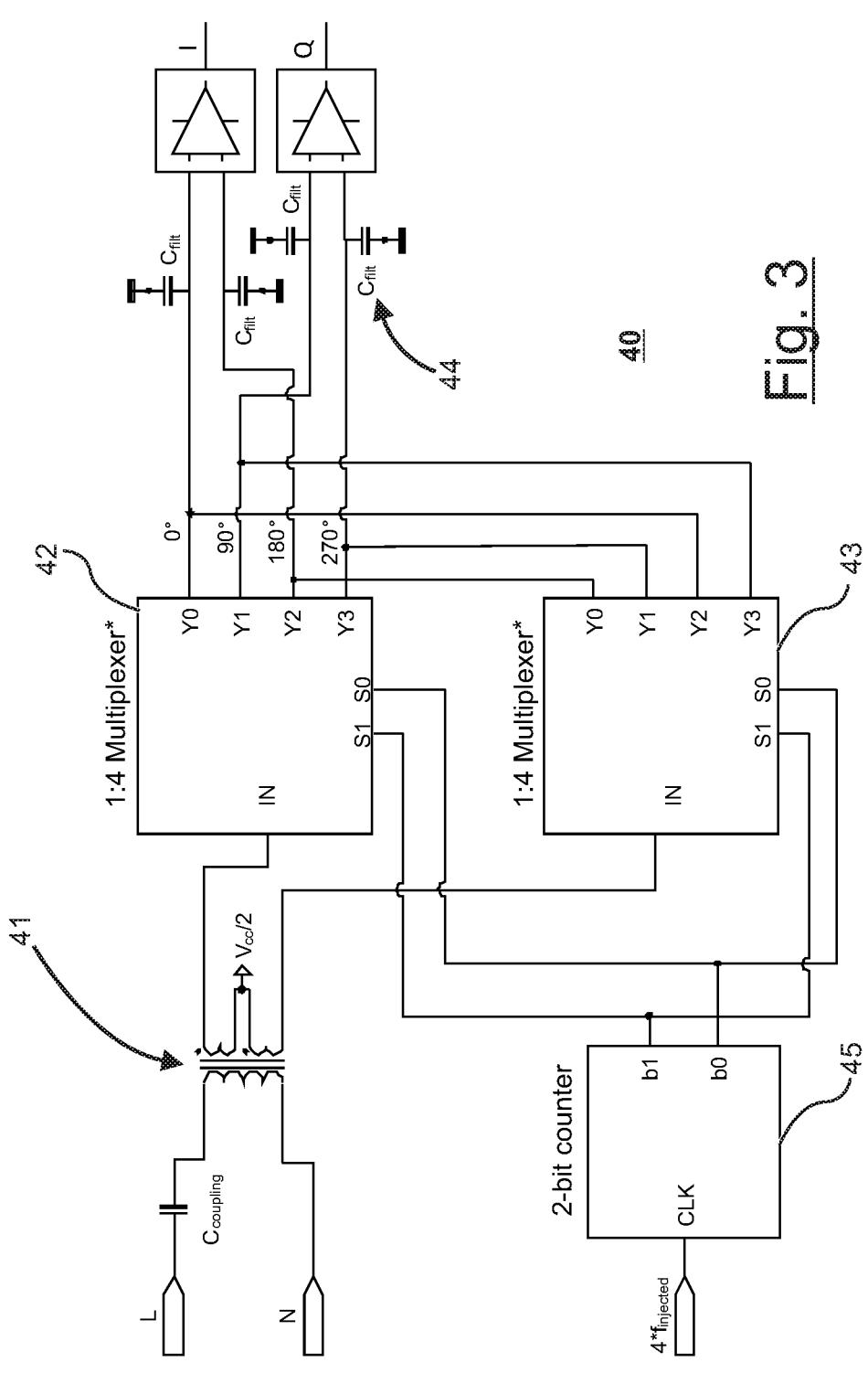
FIG. 3 illustrates a schematic circuit diagram of parts of a circuit breaker state detector of embodiments described herein.

An example of a receiver unit for receiving and detecting the test signal is shown in the schematic circuit diagram of FIG. 3. The test signal receiver includes a test signal reception stage 41 and at least one multiplexer 42, 43; in the example of FIG. 3, the test signal receiver includes two multiplexers 42, 43. The test signal reception stage 41 outputs derived versions of the received test signal, i.e. it outputs a first derived signal to multiplexer 42, and a second derived signal to multiplexer 43. The first and second derived signals are approximately 180° phase shifted to each other.

The multiplexers have their input terminals IN coupled to the test signal reception stage 41 embodied as an input transformer. The output terminals Y0, Y1, Y2, Y3 of multiplexers 42, 43 are coupled to a filter stage. Each of the output terminals Y0, Y1, Y2, Y3 provide an output signal that contains a portion of the phase of the input signal, i.e. 0° to 90°, 90° to 180°, 180° to 270°, 270° to 360°. A two-bit counter 45 is coupled to selection inputs S0, S1 of each of multiplexers 42, 43.

The multiplexers 42, 43 output the respective one of the first and second derived signals multiplied by a square wave having a frequency of about the frequency of the test signal. That is, the role of each multiplexer 42, 43 is equivalent to multiplying the input signal by the square wave. The output terminal Y0 outputs the portion of the input signal that is comprised between a phase angle of 0° and 90°. The output terminal Y1 outputs the portion of the input signal that is comprised between a phase angle of 90° and 180°. The output terminal Y2 outputs the portion of the input signal that is comprised between a phase angle of 180° and 270°. The output terminal Y3 outputs the portion of the input signal that is comprised between a phase angle of 270° and 360°. This is equivalent to multiplying the input signal with four square waves that have a value of 1 for one quarter of the period (i.e. either 0° through 90°; or 90° through 180°; or 180° through 270°; or 270° through 360°), and a value of 0 for the rest of the period. Each of the four square waves is thus time-shifted with respect to the other ones.

Returning to the embodiments shown in FIGS. 1, 2, 5, 6, the first transceiver section 30 is coupled with the input supply line at a first coupling point 61. The second transceiver section 40 is coupled with the input or output supply line at a second coupling point 62. The first and second coupling points 61, 62 are distinct from one another. In embodiments, the first and second coupling points 61, 62 are located away from one another, such as at a distance of 0.1 m or more, typically 0.25 m or more. The first and second coupling points 61, 62 may e.g. be in the vicinity of different rails.

It is noted that multiple test signal transceivers can be provided. Each of the multiple test signal transceivers is typically included in a separate unit, also referred to as a remote unit. In typical examples, one remote unit per circuit breaker is provided. In turn, typically one single test signal transceiver is provided in a unit, also referred to as a central unit.

In a first example involving the multiple test signal transceivers in the remote units, each of the test signal transceivers in the remote units injects a test signal in a time-multiplexed manner, i.e. at time slots different from the test signal transceivers in the other remote units. Alternatively, each of the test signal transceivers in the remote units injects a test signal at a different frequency. The single test signal transceiver in the central unit is configured to detect the signals appropriately, i.e. time-multiplexed, or at multiple frequencies or in multiple frequency bands at the same time.

In a second example involving the single test signal transceiver in the central unit, the test signal transceiver in the central unit injects the test signal into all input lines. The test signal transceivers in some or each of the remote units detect the presence of the test signal at their respective remote location, e.g. in the vicinity of an attributed circuit breaker.

The test signal evaluator 50 is connected to the test signal transceiver. Typically, the test signal evaluator 50 is connected at least to the part of the test signal transceiver acting as a test signal receiver, such as in the examples shown in FIGS. 1, 2, 5, 6 the second transceiver section 40. The test signal evaluator 50 is configured to determine the state of the circuit breaker 31, 32, 33 from the received test signal.

In summary, the signal processing chain is as follows: Injection of the test signal (HF injection), coupling into the electrical network, propagation of the test signal within the electrical network, coupling out of the electrical network, detection of the test signal (HF detection).

Figure 4:
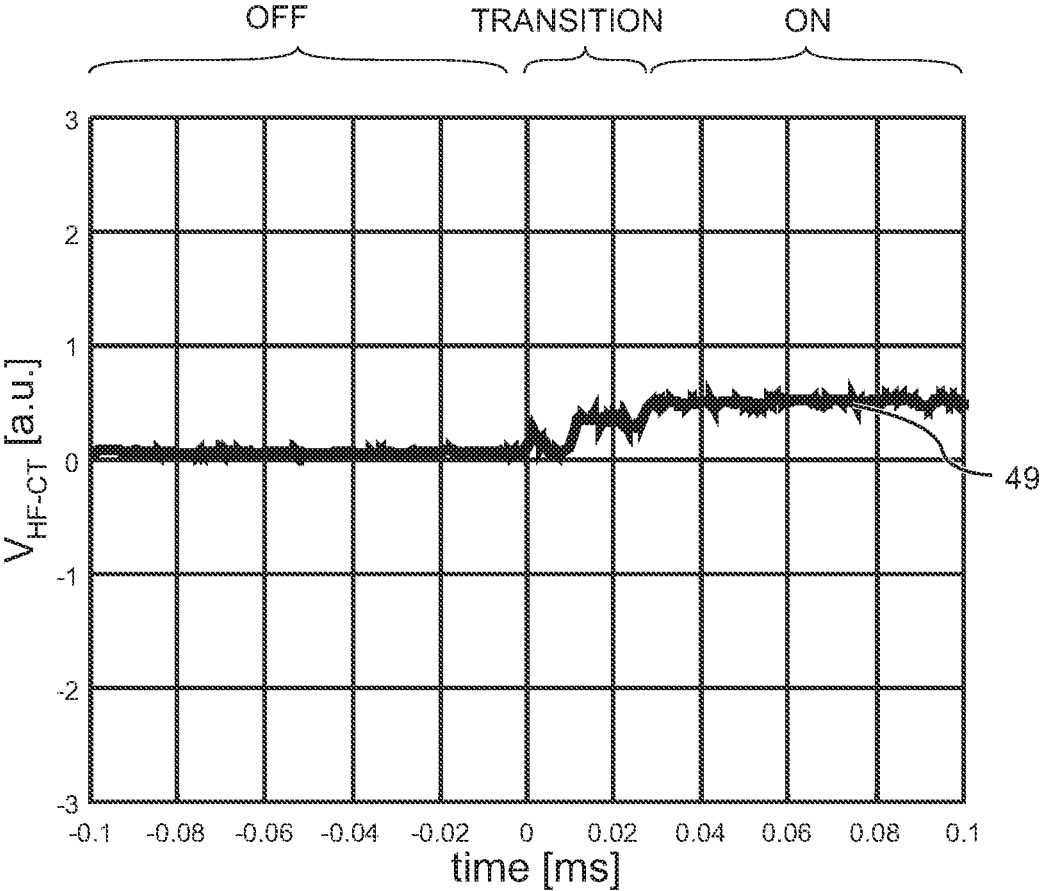
FIG. 4 shows a graph of a signal used in a circuit breaker state detector of embodiments described herein.

FIG. 4 shows a graph of an exemplary signal 49 as received by the second transceiver section 40 and evaluated by the test signal evaluator 50. In the example, the signal 49 is a smoothed representation of the actually received voltage signal in the course of time. A switching operation of the monitored circuit breaker, OFF to ON, takes place at 0 ms. As can be seen, the signal undergoes a transition period of approximately 0.03 ms after the switching operation and is raised from a level of 0 a.u. (arbitrary units) to a level of 0.5 a.u. The test signal evaluator 50 may be configured to determine the state of the circuit breaker from the signal level.

The examples proposed herein have the common advantage that it does not require any additional space on the installation rails in the cabinet in the immediate vicinity of the breakers and yet can be retrofitted to any brownfield installations, virtually regardless of the type of the circuit breaker(s), the construction etc. No mechanical coupling to the breaker is needed. Thus, the physical locations of the units are flexible, e.g. on top or bottom of the circuit breaker(s) or between the rail(s), and no special (mechanical) interface to the breaker is needed.

In the examples, the test signal is injected and propagates upstream or downstream the low-voltage network and the circuit breakers under test. The detection unit—e.g. second transceiver section 40—positioned at the circuit breaker and optionally at multiple circuit breakers or each one of the circuit breakers, and the test signal evaluator 50 allow to determine the state of the circuit breaker(s).

Returning again to the specific example of FIG. 1, the first transceiver section 30 acting as the test signal transmitter is coupled, via coupling capacitors, to input supply line 11 and neutral line 14. It is noted that the coupling to the neutral line 14 may optionally be replaced by a coupling to another input supply line 12, 13 or a ground line (not shown). In addition, while in the drawings, two coupling capacitors are shown, this is merely an example, and one coupling capacitor is sufficient when the test signal transmitter is capacitively coupled. For example, one terminal of the test signal transmitter may be coupled to the respective line via the one coupling capacitor, and another terminal of the test signal transmitter may be directly connected to the respective line.

The second transceiver section 40 acting as the test signal receiver is coupled, via a coupling reactor, to input supply line 11, i.e. upstream of the circuit breaker 31. Optionally, multiple second transceiver sections 40 may be provided to other circuit breakers. In such a configuration, a parallel state detection of the multiple circuit breakers can be performed because the injected test signal is common to all switches. Alternatively, in FIG. 1, the first transceiver section 30 may act as the test signal receiver, and the second transceiver section may act as the test signal transmitter. In such a configuration, a risk of mis-detecting the states can be reduced by sequentially activating the receivers. The example shown in FIG. 1 has an advantage in that a test signal loop 10 is partly defined.

Figure 2:
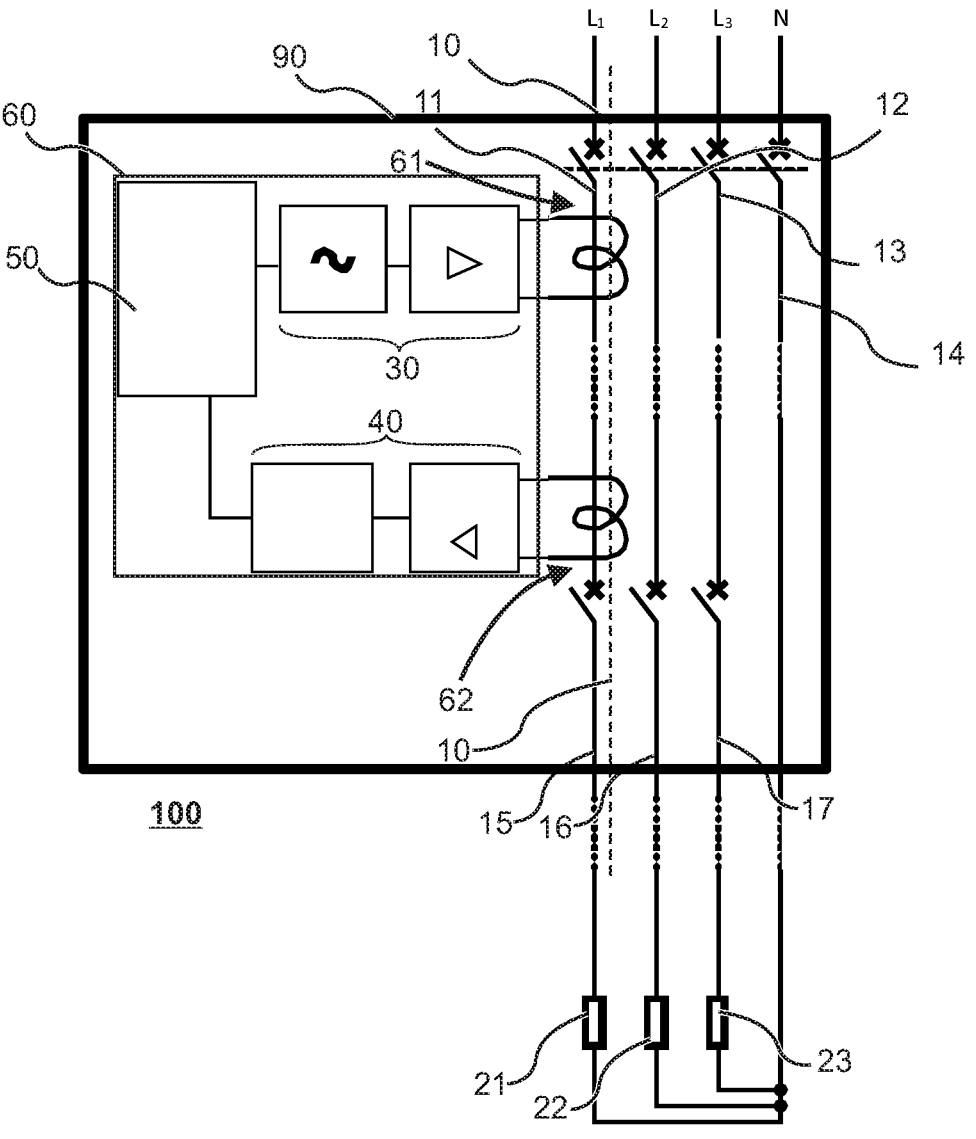
FIG. 2 illustrates a schematic diagram of a low-voltage electrical system and a circuit breaker state detector according to an embodiment.

FIG. 2 shows a specific example in which the first transceiver section 30 acting as the test signal transmitter is coupled, via a coupling reactor, to input supply line 11, and the second transceiver section 40 acting as the test signal receiver is coupled, via a coupling reactor, to input supply line 11, i.e. upstream of the circuit breaker 31. Optionally, multiple second transceiver sections 40 may be provided to other circuit breakers. In such a configuration, a parallel state detection of the multiple circuit breakers can be performed because the injected test signal is common to all switches. Alternatively, in FIG. 2, the first transceiver section 30 may act as the test signal receiver, and the second transceiver section may act as the test signal transmitter. In such a configuration, a risk of mis-detecting the states can be reduced by sequentially activating the receivers. The example shown in FIG. 2 has an advantage in that there is a galvanic isolation for both the first transceiver section 30 and the second transceiver section 40.

Figure 5:
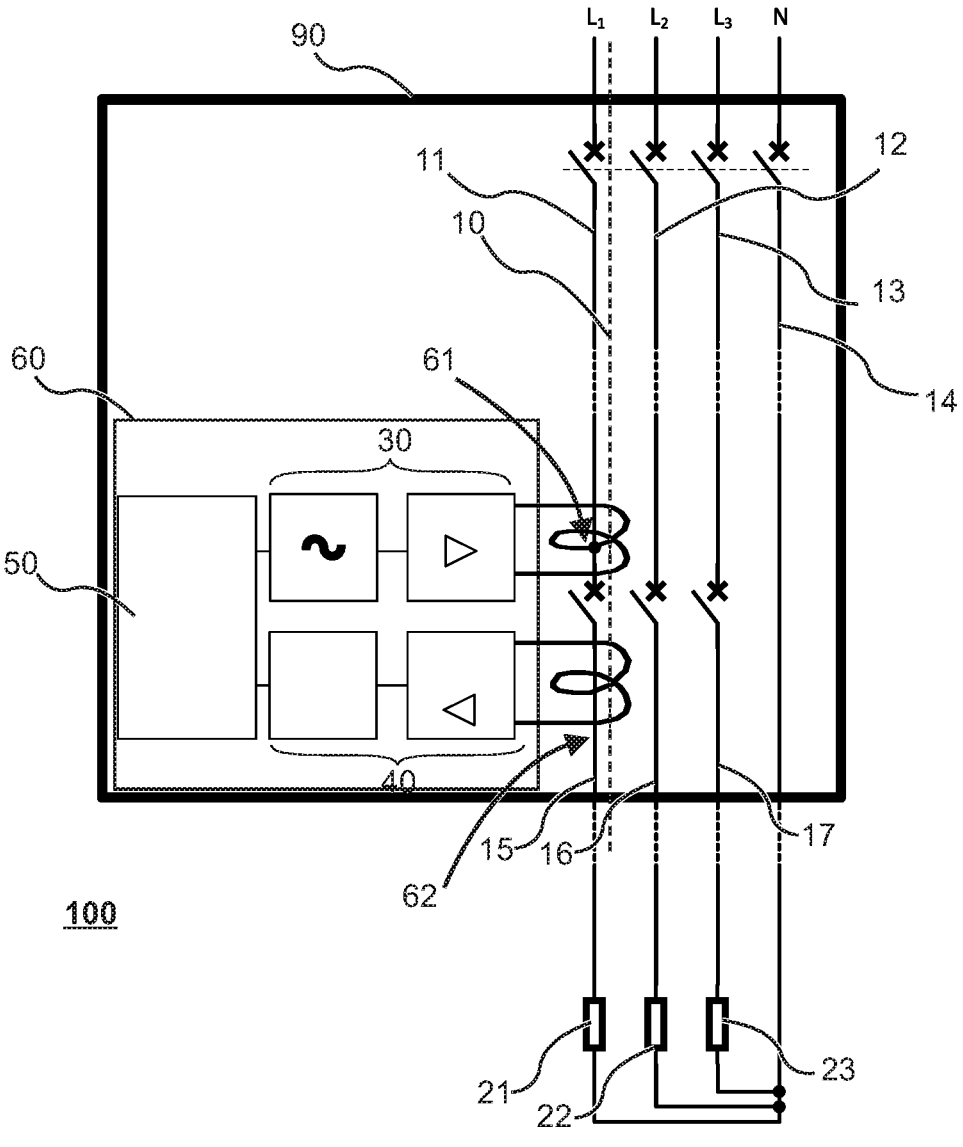
FIG. 5 illustrates a schematic diagram of a low-voltage electrical system and a circuit breaker state detector according to an embodiment.

FIG. 5 shows a specific example similar to that of FIG. 2; however, the second transceiver section 40 acting as the test signal receiver is coupled, via a coupling reactor, to output supply line 15, i.e. downstream of the circuit breaker 31. Optionally, multiple second transceiver sections 40 may be provided to other circuit breakers. In such a configuration, a parallel state detection of the multiple circuit breakers can be performed because the injected test signal is common to all switches. Alternatively, in FIG. 5, the first transceiver section 30 may act as the test signal receiver, and the second transceiver section may act as the test signal transmitter. In such a configuration, a risk of mis-detecting the states can be reduced by sequentially activating the receivers. The example shown in FIG. 5 has an advantage in that the test signal path 10 is short and thus well defined, such that a leaking of the high-frequency test signal outside of the cabinet 90 is reduced. Optionally, the first transceiver section 30, the second transceiver section 40 and the test signal evaluator 50 are integrated in a same housing (not shown). This may help in improving the operability and in achieving a clear arrangement of the parts in the cabinet.

Figure 6:
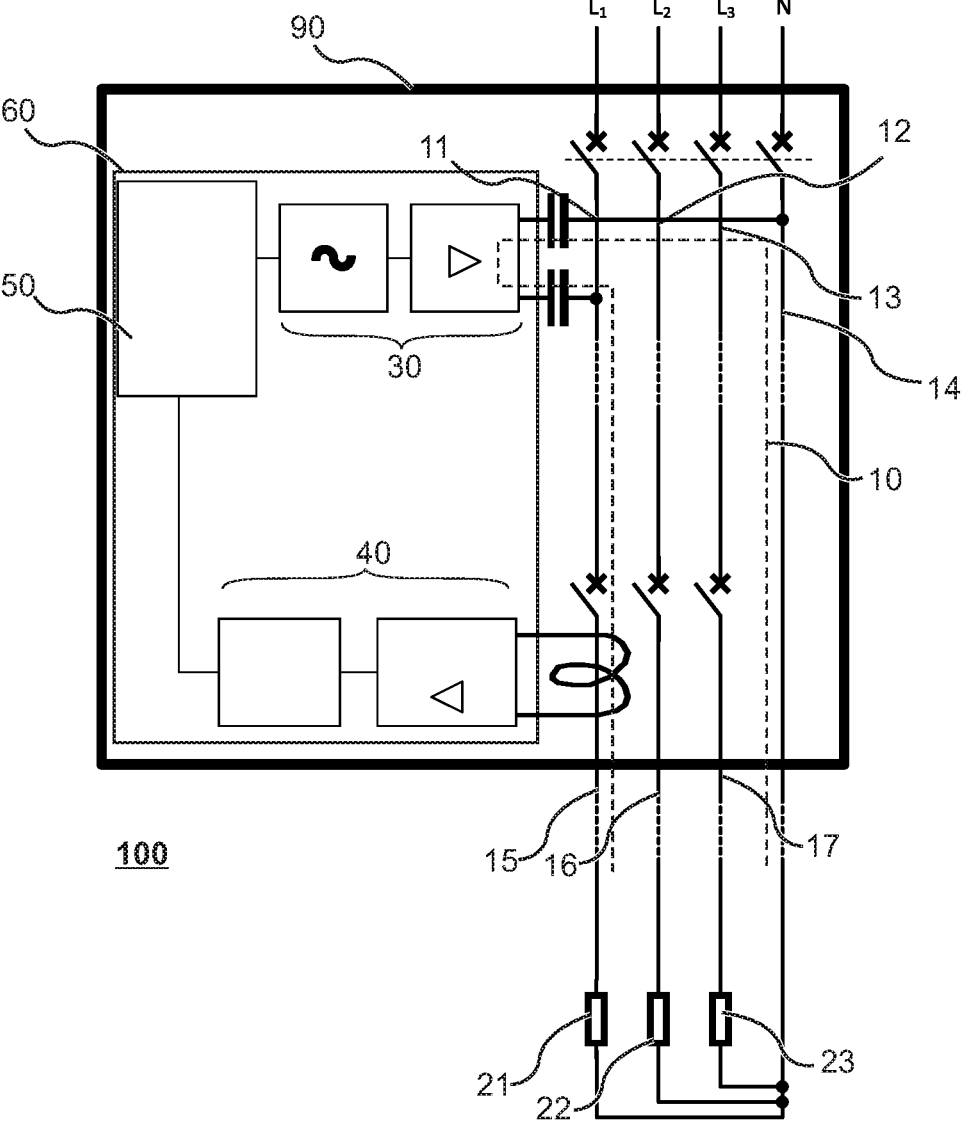
FIG. 6 illustrates a schematic diagram of a low-voltage electrical system and a circuit breaker state detector according to an embodiment.

FIG. 6 shows a specific example similar to that of FIG. 5; however, a distance between the first transceiver section 30 and the second transceiver section 40 is enlarged. Also, the coupling of the first transceiver section 30 is capacitive, whereas the coupling of the second transceiver section 40 is inductive. In FIG. 6, the first transceiver section 30 and the test signal evaluator 50 are included in a unit (not shown), and the second transceiver section 40 is connected to this unit. This may help in reducing the wiring complexity in the case of multiple second transceiver sections 40. Alternatively, the second transceiver section 40 and the test signal evaluator 50 are included in another unit (not shown), and this unit is located next to the circuit breaker.

The person skilled in the art will understand that the way of coupling the first transceiver section 30 either capacitively (as e.g. in FIGS. 1 and 6) or inductively (as e.g. in FIGS. 2 and 5) is only shown by way of example, and the way of coupling of the first transceiver sections 30 in the embodiments discussed herein may be chosen according to the need and/or specific situation at the site.

The invention claimed is:

1. A circuit breaker state detector for determining a state of a circuit breaker, the circuit breaker connected between an input supply line and an output supply line of a low-voltage electrical system, the circuit breaker state detector comprising a test signal transceiver and a test signal evaluator, wherein the test signal transceiver comprises a first transceiver section being inductively or capacitively coupled, at a first coupling point, with the input supply line, and a second transceiver section being inductively coupled, at a second coupling point, with the input supply line, wherein both the first coupling point and the second coupling point are located along the input supply line, wherein one of the first transceiver section and the second transceiver section is a test signal transmitter configured to generate an AC test signal and inject the test signal into the input supply line, wherein the other one of the first transceiver section and the second transceiver section is a test signal receiver configured to receive the test signal from the input supply line, and wherein the test signal evaluator is connected to the test signal transceiver and configured to determine the state of the circuit breaker from the received test signal.

2. The circuit breaker state detector of claim 1, wherein the circuit breaker state detector comprises a first unit including the first transceiver section and the test signal evaluator and a second unit including the second transceiver section, the second unit being located next to the circuit breaker, and the second unit being located at a distance from the first unit.

3. The circuit breaker state detector of claim 1, wherein the circuit breaker state detector comprises a first unit including the first transceiver section and a second unit including the second transceiver section and the test signal evaluator, the second unit being located next to the circuit breaker, and the second unit being located at a distance from the first unit.

4. The circuit breaker state detector of claim 1, wherein the first transceiver section, the second transceiver section and the test signal evaluator are integrated in a same housing located next to the circuit breaker.

5. The circuit breaker state detector of claim 1, comprising at least two second transceiver sections each inductively coupled with a different input supply line or output supply line to receive the test signal as a line-attributed test signal from the respective input or output supply line.

6. The circuit breaker state detector of claim 1, wherein the test signal has a frequency of more than 100 kHz, more than 500 kHz, or between 500 kHz and 100 MHz.

7. The circuit breaker state detector of claim 1, wherein the test signal transmitter is configured to generate a continuous sinusoidal signal or a pulsed sinusoidal signal or a pulsed square wave as the test signal.

8. The circuit breaker state detector of claim 1, wherein the test signal evaluator is configured to evaluate a variation of the received test signal over time to determine the state of the circuit breaker.

9. A low-voltage electrical system having at least one input supply line and at least one output supply line coupleable with a load, the system comprising:
a circuit breaker having a circuit breaker input connected to the input supply line and having a circuit breaker output connected to the output supply line; and
the circuit breaker state detector of claim 1.

10. The low-voltage electrical system of claim 9, wherein the low-voltage electrical system is an AC system comprising an input supply line for each phase and an output supply line for each phase, and wherein the first transceiver section and the second transceiver section are coupled between input and/or output supply lines of different phases.

11. The low-voltage electrical system of claim 9, wherein the low-voltage electrical system is an AC system comprising an input supply line for each phase and an output supply for each phase, and comprising a neutral line and/or a ground line, and wherein the first transceiver section and the second transceiver section are coupled between input and/or output supply lines and the neutral line or the ground line.

12. The low-voltage electrical system of claim 9, wherein the low-voltage electrical system is a DC system comprising an input supply line for each polarity and an output supply line for each polarity, and wherein the first transceiver section and the second transceiver section are coupled between input and/or output supply lines of different polarities.

13. The circuit breaker state detector of claim 1, wherein the state of the circuit breaker includes an information as to whether a path across the circuit breaker is conductive or tripped.

14. The circuit breaker state detector of claim 1, wherein the first and second coupling points are located away from each other at a distance of 0.1 meter or more.

15. A circuit breaker state detector for determining a state of a circuit breaker, the circuit breaker connected between an input supply line and an output supply line of a low-voltage electrical system, the circuit breaker state detector comprising a test signal transceiver and a test signal evaluator, wherein the test signal transceiver comprises a first transceiver section being capacitively or inductively coupled, at a first coupling point, with the input supply line, and a second transceiver section being inductively coupled, at a second coupling point, with the input supply line or the output supply line, wherein one of the first transceiver section and the second transceiver section is a test signal transmitter configured to generate an AC test signal and inject the test signal into the input or output supply line, wherein the other one of the first transceiver section and the second transceiver section is a test signal receiver configured to receive the test signal from the input or output supply line, wherein the test signal evaluator is connected to the test signal transceiver and configured to determine the state of the circuit breaker from the received test signal, wherein the test signal receiver comprises a test signal reception stage and at least one multiplexer having an input terminal coupled with an output terminal of the test signal reception stage and having output terminals coupled with a filter stage, wherein the test signal reception stage is configured to receive the test signal and output a first derived signal and a second derived signal of the test signal at the output terminal, the first and second derived signals being approximately 180° phase shifted to each other, and wherein the at least one multiplexer is configured to output the respective first and second derived signals multiplied by a square wave having a frequency of about a frequency of the test signal.

16. A circuit breaker state detector for determining a state of a circuit breaker, the circuit breaker connected between an input supply line and an output supply line of a low-voltage electrical system, the circuit breaker state detector comprising a test signal transceiver and a test signal evaluator, wherein the test signal transceiver comprises a first transceiver section being capacitively or inductively coupled, at a first coupling point, with the input supply line, and a second transceiver section being inductively coupled, at a second coupling point, with the input supply line or the output supply line, wherein one of the first transceiver section and the second transceiver section is a test signal transmitter configured to generate an AC test signal and inject the test signal into the input or output supply line, wherein the other one of the first transceiver section and the second transceiver section is a test signal receiver configured to receive the test signal from the input or output supply line, wherein the test signal evaluator is connected to the test signal transceiver and configured to determine the state of the circuit breaker from the received test signal, wherein the test signal transceiver further comprises a test signal reception stage and at least one multiplexer having an input terminal coupled with an output terminal of the test signal reception stage and having output terminals coupled with a filter stage, and wherein the test signal reception stage is configured to receive the test signal and output a first derived signal and a second derived signal of the test signal at the output terminal.

17. A circuit breaker state detector for determining a state of a circuit breaker, the circuit breaker connected between an input supply line and an output supply line of a low-voltage electrical system, the circuit breaker state detector comprising a test signal transceiver and a test signal evaluator, wherein the test signal transceiver comprises a first transceiver section being capacitively or inductively coupled, at a first point, with the input supply line, and at least two second transceiver sections each inductively coupled with a different input supply line, wherein both the first coupling point and the second coupling point are located along the input supply line, wherein one of the first transceiver section and the second transceiver section is a test signal transmitter configured to generate an alternating current (AC) test signal and inject the test signal into the input supply line, wherein the other one of the first transceiver section and the second transceiver section is a test signal receiver configured to receive the test signal from the input supply line, wherein the test signal evaluator is connected to the test signal transceiver and configured to determine the state of the circuit breaker from the received test signal, and wherein each second transceiver section receives the test signal as a line attributed test signal from the respective input or output supply line.

\* \* \* \* \*